(12) United States Patent
Gould et al.

(10) Patent No.: US 10,559,483 B2
(45) Date of Patent: Feb. 11, 2020

(54) PLATFORM ARCHITECTURE TO IMPROVE SYSTEM PRODUCTIVITY

(71) Applicant: LAM RESEARCH CORPORATION, Fremont, CA (US)

(72) Inventors: Richard H. Gould, Fremond, CA (US); Candi Kristoffersen, San Jose, CA (US); Gustavo G. Francken, Pleasanton, CA (US); James Van Gogh, Sunnyvale, CA (US); Benjamin W. Mooring, Cedar Park, TX (US)

(73) Assignee: LAM RESEARCH CORPORATION, Fremont, CA (US)

( * ) Notice: Subject to any disclaimer, the term of this patent is extended or adjusted under 35 U.S.C. 154(b) by 169 days.

(21) Appl. No.: 15/671,827

(22) Filed: Aug. 8, 2017

(65) Prior Publication Data

US 2018/0047598 A1 Feb. 15, 2018

Related U.S. Application Data

(60) Provisional application No. 62/403,343, filed on Oct. 3, 2016, provisional application No. 62/378,799, filed on Aug. 24, 2016, provisional application No. 62/378,789, filed on Aug. 24, 2016, provisional application No. 62/373,035, filed on Aug. 10, 2016.

(51) Int. Cl.
*H01L 21/67* (2006.01)

(52) U.S. Cl.
CPC .. *H01L 21/67201* (2013.01); *H01L 21/67178* (2013.01)

(58) Field of Classification Search
CPC ............... H01L 21/67178; H01L 21/67201
See application file for complete search history.

(56) References Cited

U.S. PATENT DOCUMENTS

| | | | | |
|---|---|---|---|---|
| 6,152,070 | A * | 11/2000 | Fairbairn | H01L 21/67201 118/719 |
| 7,246,985 | B2 * | 7/2007 | Ferrara | H01L 21/67201 414/217 |
| 7,351,291 | B2 * | 4/2008 | Murakami | H01L 21/67201 118/719 |
| 7,665,951 | B2 * | 2/2010 | Kurita | H01L 21/67201 414/217 |
| 7,695,232 | B2 * | 4/2010 | Moore | H01L 21/67201 414/217 |

(Continued)

*Primary Examiner* — James Keenan

(57) ABSTRACT

A loading station for a substrate processing system includes first and second vertically-stacked loading stations. The first loading station includes a first airlock volume and first and second valves arranged at respective ends of the first loading station. The first and second valves are configured to selectively provide access to the first airlock volume and include first and second actuators, respectively, configured to open and close the first and second valves, and the first and second actuators extend downward from the first loading station. The second loading station includes a second airlock volume and third and fourth valves arranged at respective ends of the second loading station. The third and fourth valves are configured to selectively provide access to the second airlock volume and include third and fourth actuators, respectively, configured to open and close the third and fourth valves.

12 Claims, 14 Drawing Sheets

(56) References Cited

U.S. PATENT DOCUMENTS

| | | | | |
|---|---|---|---|---|
| 8,033,769 B2* | 10/2011 | Gage | ................. | H01L 21/67196 |
| | | | | 414/217 |
| 8,124,907 B2* | 2/2012 | Lee | ................... | H01L 21/67201 |
| | | | | 156/345.54 |
| 8,662,812 B2* | 3/2014 | Hofmeister | ....... | H01L 21/67126 |
| | | | | 414/217 |
| 9,355,876 B2* | 5/2016 | Reuter | ................ | H01L 21/6719 |
| 9,502,275 B1* | 11/2016 | Trussell | ............ | H01L 21/67155 |
| 2004/0141832 A1* | 7/2004 | Jang | ................. | H01L 21/67161 |
| | | | | 414/217 |
| 2006/0177288 A1* | 8/2006 | Parker | ............... | H01L 21/67201 |
| | | | | 414/217 |
| 2009/0320948 A1* | 12/2009 | Asanuma | .......... | H01L 21/67201 |
| | | | | 137/627.5 |
| 2013/0224953 A1* | 8/2013 | Salinas | ............. | H01L 21/02063 |
| | | | | 438/689 |
| 2015/0096685 A1* | 4/2015 | Sato | ................. | H01L 21/67201 |
| | | | | 156/345.32 |
| 2015/0311102 A1* | 10/2015 | Weiss | ................ | H01L 21/67126 |
| | | | | 414/222.01 |

* cited by examiner

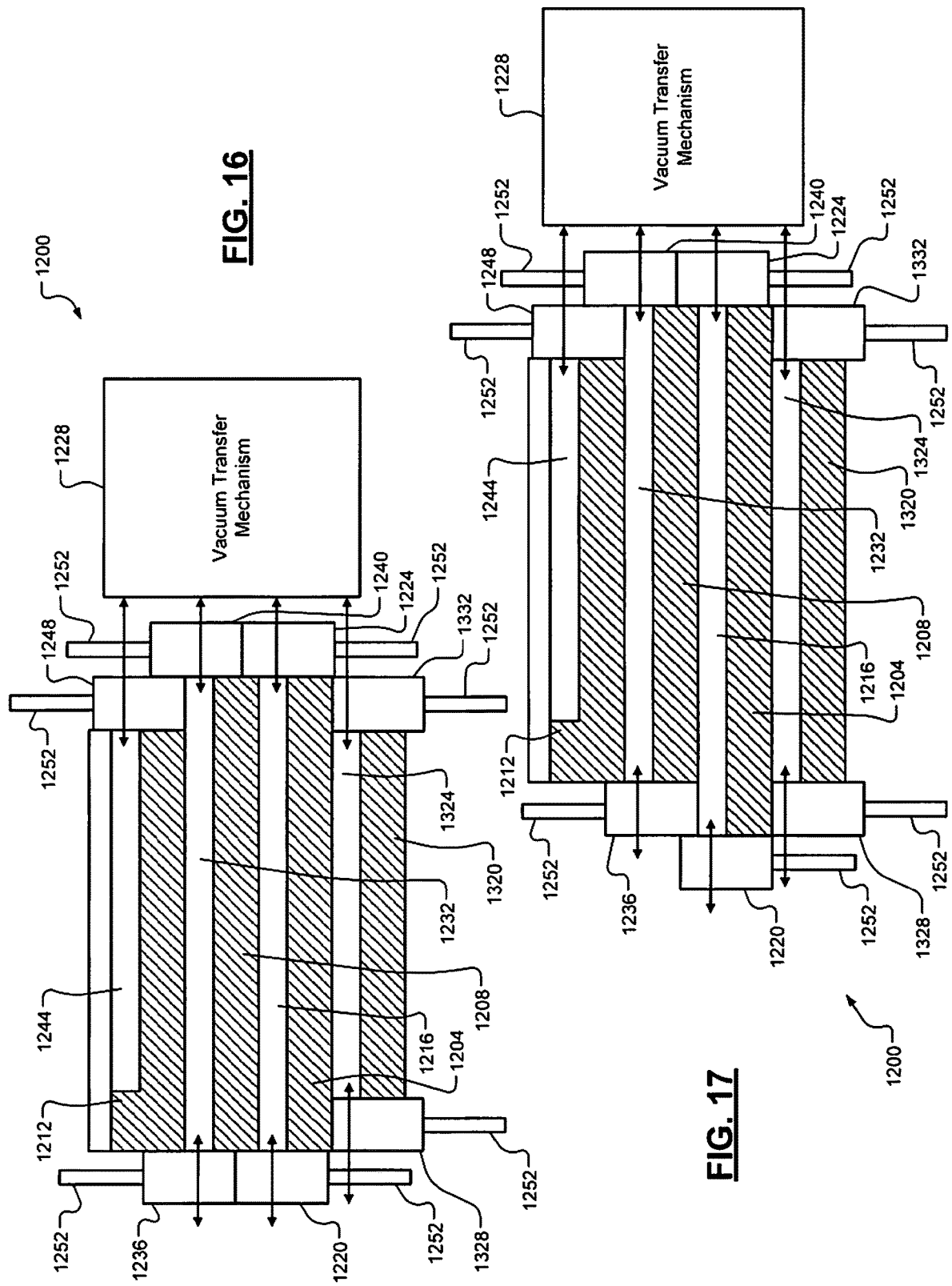

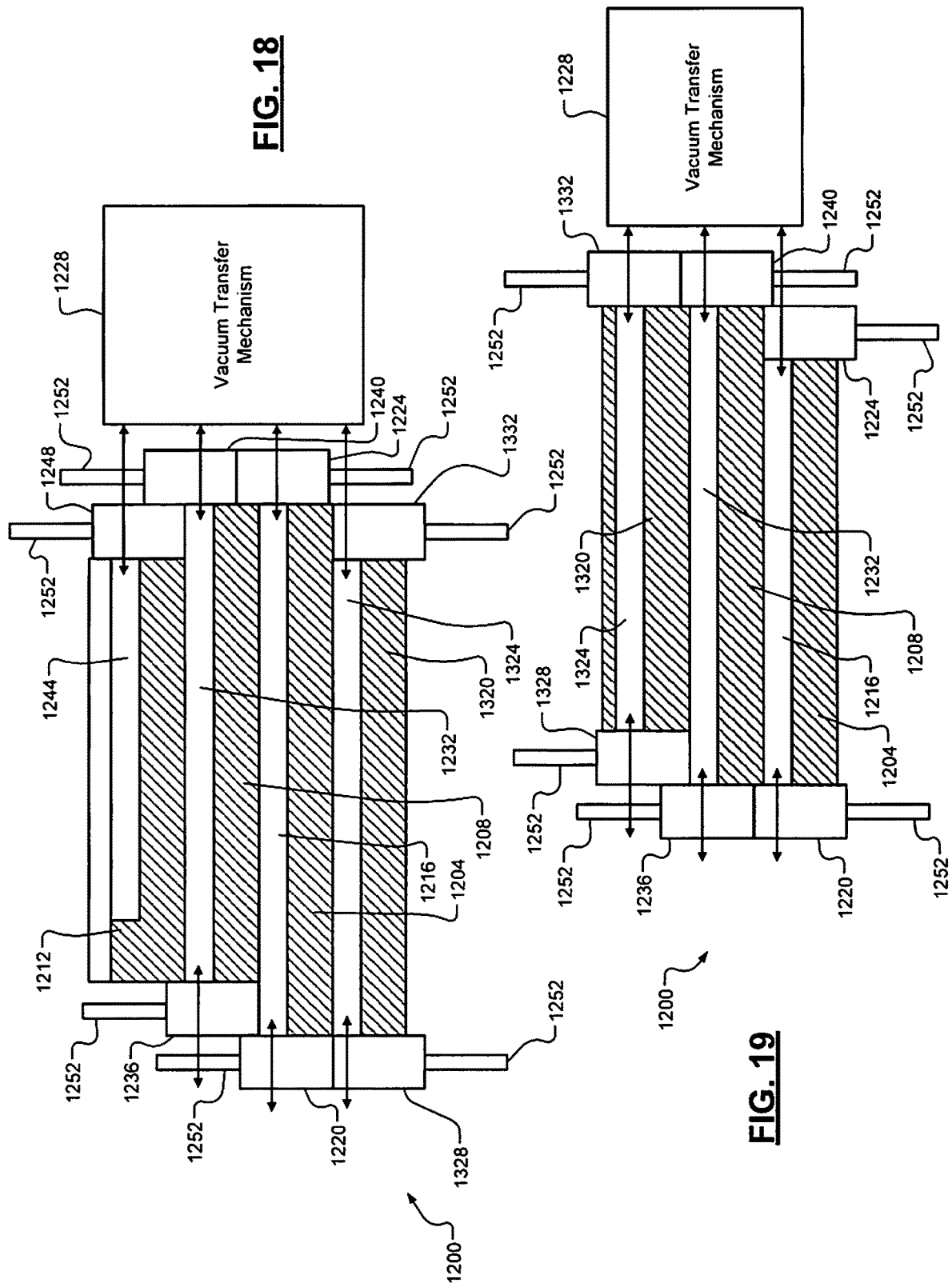

PLATFORM ARCHITECTURE TO IMPROVE SYSTEM PRODUCTIVITY

CROSS-REFERENCE TO RELATED APPLICATIONS

This application claims the benefit of U.S. Provisional Application No. 62/373,035, filed on Aug. 10, 2016, U.S. Provisional Application No. 62/378,789, filed on Aug. 24, 2016, U.S. Provisional Application No. 62/378,799, filed on Aug. 24, 2016, and U.S. Provisional Application No. 62/403,343, filed on Oct. 3, 2016. The entire disclosures of the applications referenced above are incorporated herein by reference.

FIELD

The present disclosure relates to substrate processing systems, and more particularly to configurations of substrate processing tools in a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A substrate processing system may be used to perform deposition, etching and/or other treatment of substrates such as semiconductor wafers. During processing, a substrate is arranged on a substrate support in a processing chamber of the substrate processing system. During etching or deposition, gas mixtures including one or more etch gases or gas precursors, respectively, are introduced into the processing chamber and plasma may be struck to activate chemical reactions.

The substrate processing system may include a plurality of substrate processing tools arranged within a fabrication room. Each of the substrate processing tools may include a plurality of process modules. Typically, a substrate processing tool includes up to 6 process modules.

Referring now to FIG. 1, a top-down view of an example substrate processing tool 100 is shown. The substrate processing tool 100 includes a plurality of process modules 104. For example only, each of the process modules 104 may be configured to perform one or more respective processes on a substrate. Substrates to be processed are loaded into the substrate process tool 100 via ports of a loading station of an equipment front end module (EFEM) 108 and then transferred into one or more of the process modules 104. For example, a substrate may be loaded into each of the process modules 104 in succession. Referring now to FIG. 2, an example arrangement 200 of a fabrication room 204 including plurality of substrate processing tools 208 is shown.

SUMMARY

A loading station for a substrate processing system has a vertically-stacked configuration and includes a first loading station and a second loading station arranged above and adjacent to the first loading station. The first loading station includes a first airlock volume and a first valve and a second valve arranged at respective ends of the first loading station. The first valve and the second valve are configured to selectively provide access to the first airlock volume, the first valve and the second valve include a first actuator and a second actuator, respectively, configured to open and close the first valve and the second valve, and the first actuator and the second actuator extend downward from the first loading station. The second loading station includes a second airlock volume and a third valve and a fourth valve arranged at respective ends of the second loading station. The third valve and the fourth valve are configured to selectively provide access to the second airlock volume and the third valve and the fourth valve include a third actuator and a fourth actuator, respectively, configured to open and close the third valve and the fourth valve.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 16 is an example loading station in a fourth vertically stacked configuration;

FIG. 17 is an example loading station in a fifth vertically stacked configuration;

FIG. 18 is an example loading station in a sixth vertically stacked configuration;

FIG. 19 is an example loading station in a seventh vertically stacked configuration;

In the drawings, reference numbers may be reused to identify similar and/or identical elements.

DETAILED DESCRIPTION

The quantity, position, etc. of substrate processing tools within a fabrication room may be constrained by the dimensions and respective configurations of the substrate processing tools. Accordingly, the configurations of the substrate processing tools define a tool footprint, spacing, and/or pitch, which further define a tool density of the fabrication room. Tool density may refer to a number of substrate processing tools and/or process modules per unit area of a fabrication room. Systems and methods according to the principles of the present disclosure provide various substrate processing tool configurations to maximize substrate processing tool density.

Figure 3:
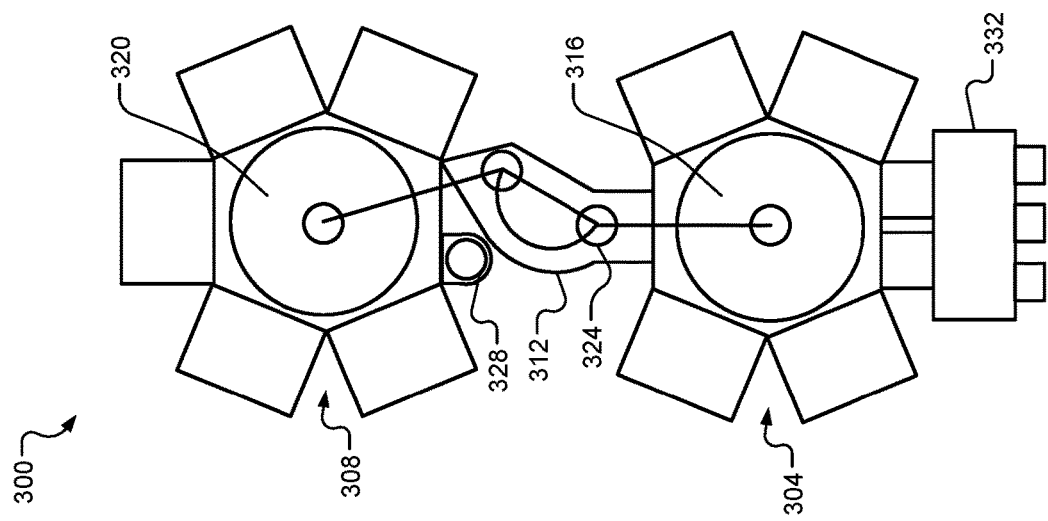
FIG. 3 is a first example configuration of substrate processing tools.

FIG. 3 shows a first example configuration 300 including a first substrate processing tool 304 and a second substrate processing tool 308 according to the principles of the present disclosure. The first substrate processing tool 304 and the second substrate processing tool 308 are arranged sequentially and are connected by a transfer stage 312, which is under vacuum. As shown, the transfer stage 312 includes a pivoting transfer mechanism configured to transfer substrates between a vacuum transfer module (VTM) 316 of the first substrate processing tool 304 and a VTM 320 of the second substrate processing tool 308. However, in other examples, the transfer stage 312 may include other suitable transfer mechanisms, such as a linear transfer mechanism. For example only, a first robot (not shown) of the VTM 316 may place a substrate on a support 324 arranged in a first position, the support 324 is pivoted to a second position, and a second robot (not shown) of the VTM 320 retrieves the substrate from the support 324 in the second position. In some examples, the second substrate processing tool 308 may include a storage buffer 328 configured to store one or more substrates between processing stages.

The transfer mechanism may also be stacked to provide two or more transfer systems between the substrate processing tools 308 and 304. Transfer stage 324 may also have multiple slots to transport or buffer multiple substrates at one time.

In the configuration 300, the first substrate processing tool 304 and the second substrate processing tool 308 are configured to share a single equipment front end module (EFEM) 332.

Figure 4:
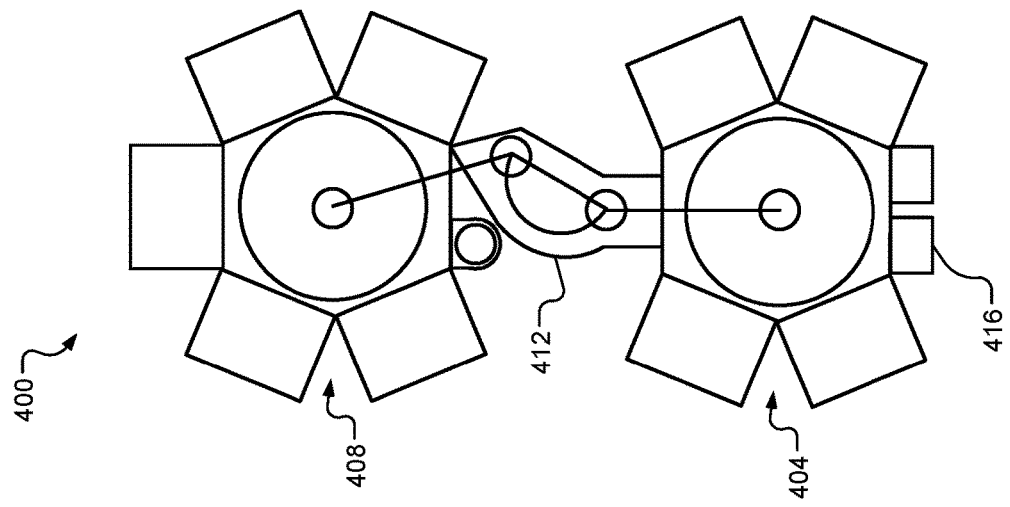
FIG. 4 is a second example configuration of substrate processing tools.

FIG. 4 shows a second example configuration 400 including a first substrate processing tool 404 and a second substrate processing tool 408 arranged sequentially and connected by a transfer stage 412. The configuration 400 is similar to the configuration 300 of FIG. 3 except that in the configuration 400, the EFEM is eliminated. Accordingly, substrates may be loaded into the first substrate processing tool 408 directly via airlock loading stations 416 (e.g., using a storage or transport carrier such as a vacuum wafer carrier, front opening unified pod (FOUP), etc., or other suitable mechanisms).

Figure 2:
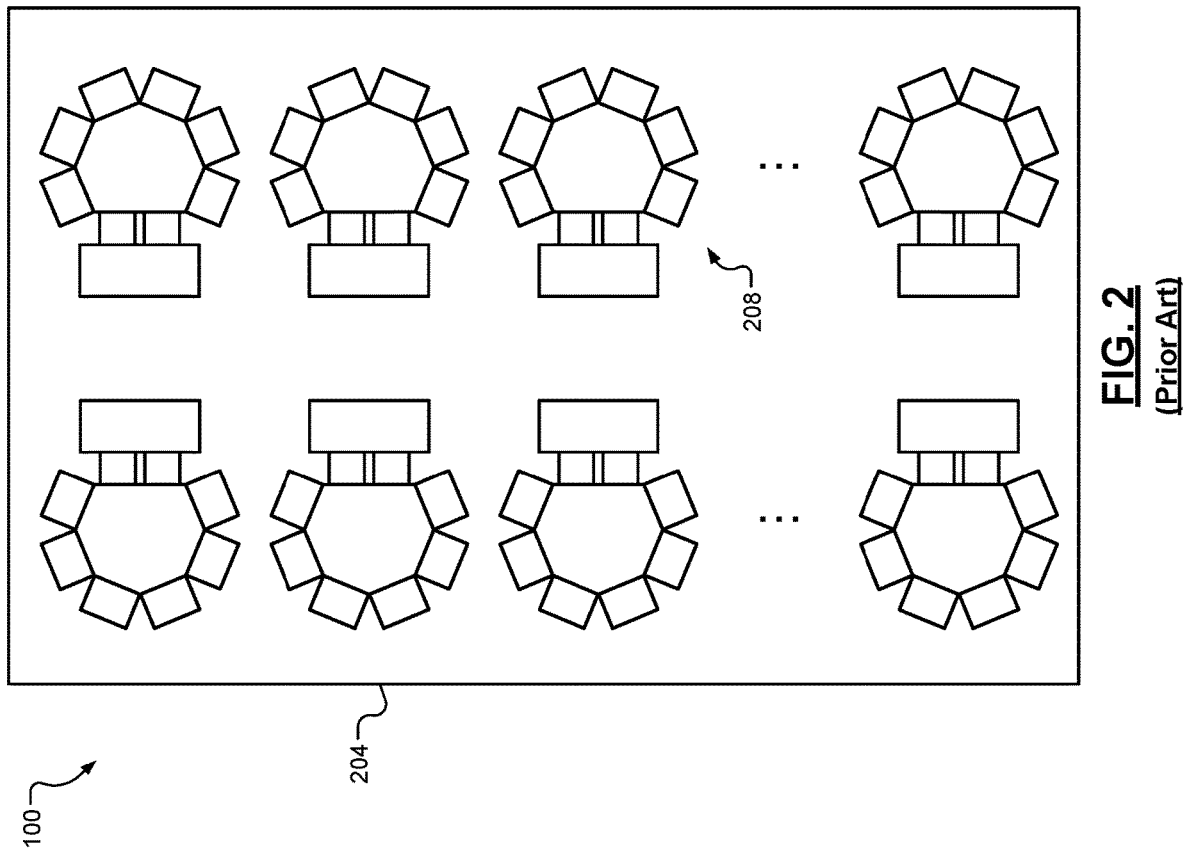
FIG. 2 illustrates an example arrangement of substrate processing tools within a fabrication room.
Figure 1:
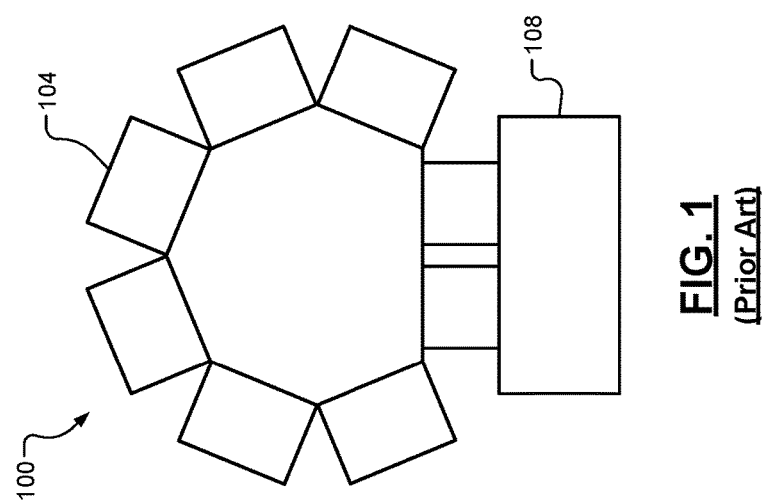
FIG. 1 is an example substrate processing tool.
Figure 5:
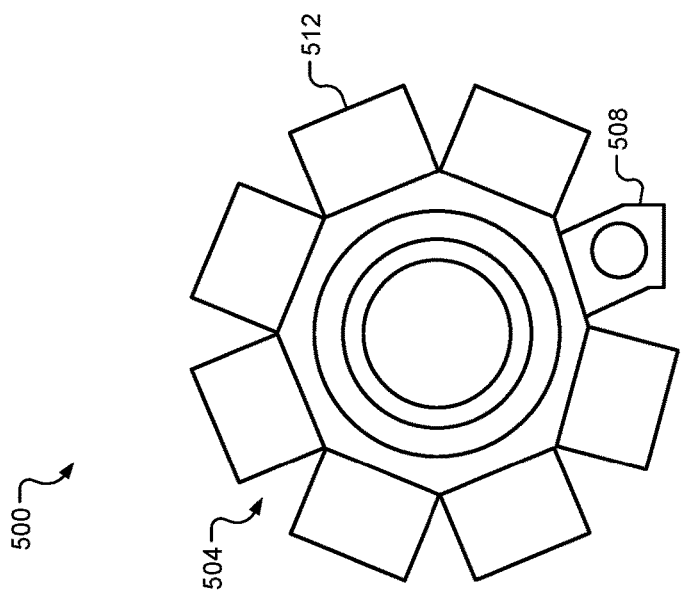
FIG. 5 is a third example configuration of a substrate processing tool.

FIG. 5 shows a third example configuration 500 including a substrate processing tool 504. The configuration 500 eliminates the EFEM and uses only a single loading station 508, allowing for a greater number (e.g., 7) of process modules 512. At the loading station 508, substrates may be loaded into the first substrate processing tool 408 directly via airlock loading station 416 (e.g., using a storage or transport pod such as a Vacuum Wafer Carrier, front opening unified pod (FOUP), etc., or other suitable mechanisms).

Figure 6:
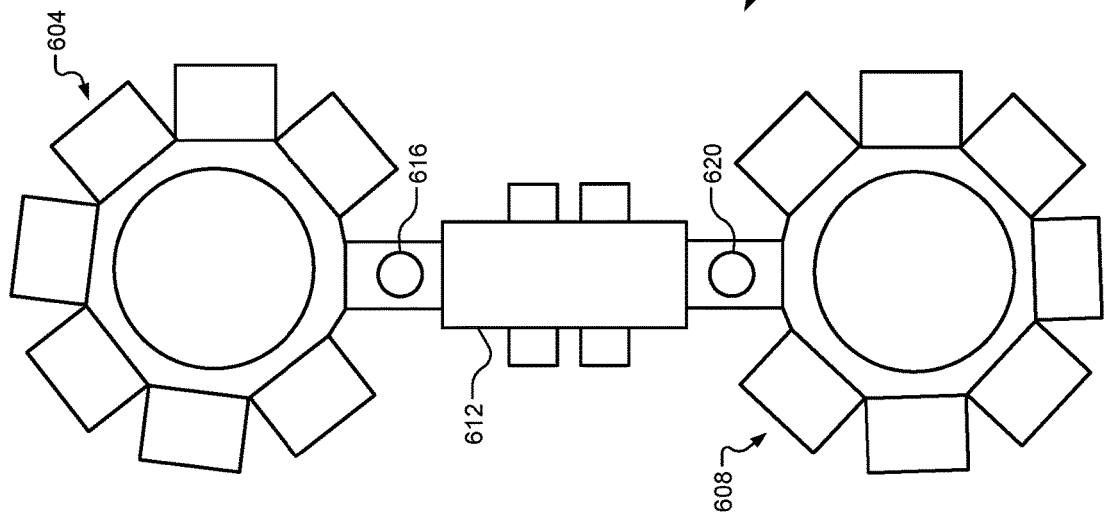
FIG. 6 is a fourth example configuration of substrate processing tools.

FIG. 6 shows a fourth example configuration 600 including a first substrate processing tool 604 and a second substrate processing tool 608 sharing a single EFEM 612. More specifically, the first substrate processing tool 604 and the second substrate processing tool 608 are connected to respective ends of the EFEM 612 via respective loading stations 616 and 620. The loading stations 616 and 620 may each have a stacked configuration.

Figure 7:
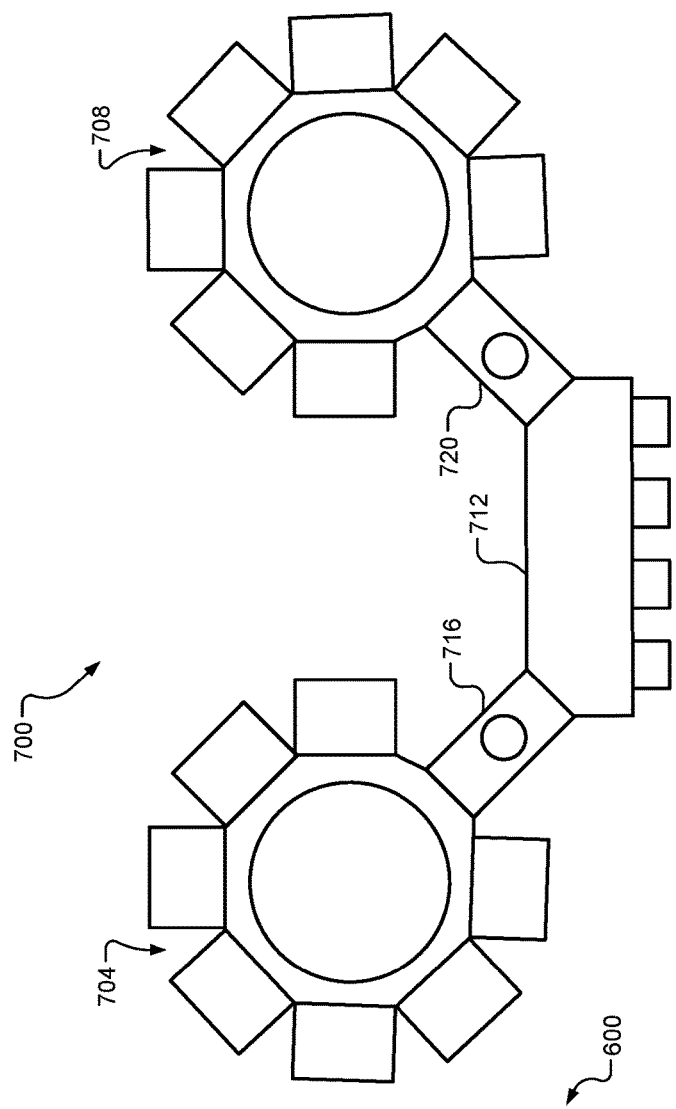
FIG. 7 is a fifth example configuration of substrate processing tools.

FIG. 7 shows a fifth example configuration 700 including a first substrate processing tool 704 and a second substrate processing tool 708 sharing a single EFEM 712. The first substrate processing tool 704 and the second substrate processing tool 708 are connected to respective ends of the EFEM 712 via respective loading stations 716 and 720. The loading stations 716 and 720 may each have a stacked configuration.

Figure 8:
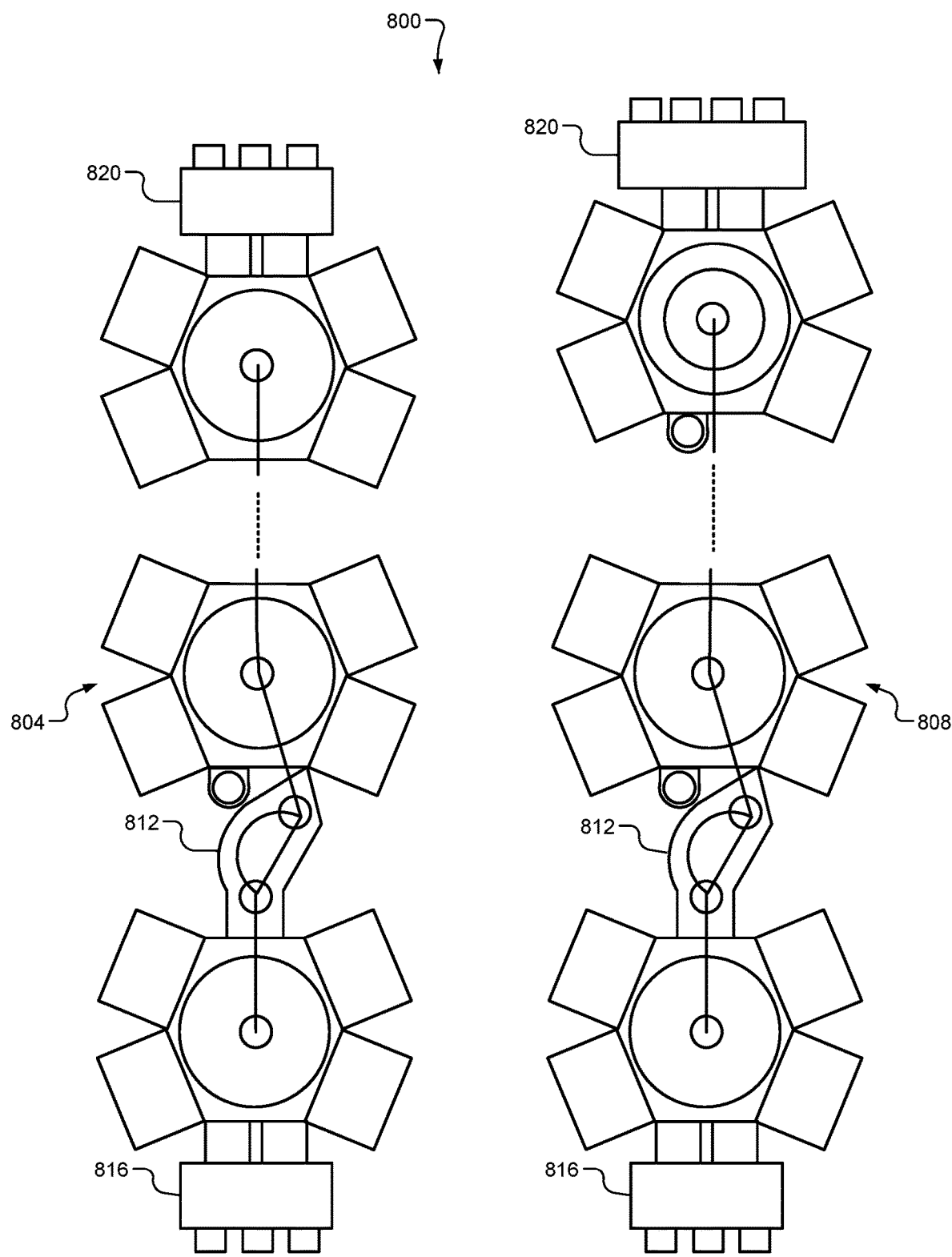
FIG. 8 is a sixth example configuration of substrate processing tools.
Figure 9:
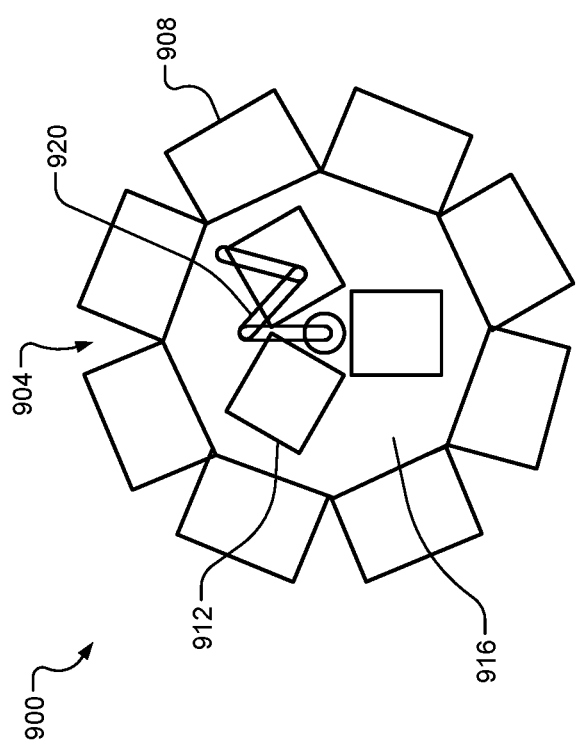
FIG. 9 is a seventh example configuration of a substrate processing tool.

FIG. 8 shows a sixth example configuration 800 including one or more rows of sequentially arranged substrate processing tools 804, 808, etc. In the configuration 800, each row may include 3 or more substrate processing tools connected via respective transfer stages 812. The transfer stages 812 may include pivoting transfer mechanisms, linear transfer mechanisms, etc. A first EFEM 816 is provided at a first end of the row of substrate processing tools 804, 808 and a second EFEM 820 is provided at a second end of the row of substrate processing tools 804, 808. For example, substrates may be loaded at the first EFEM 816, processed and transferred sequentially through the various process modules of the substrate processing tools 804, 808, and then unloaded/retrieved from the second EFEM 820. In some examples, transfer mechanisms within the transfer stages 812 may be vertically stacked to provide two or more transfer systems between adjacent substrate processing tools. The transfer stages 812 may also have multiple slots to move or buffer multiple substrates at one time FIG. 9 shows a seventh example configuration 900 including a substrate processing tool 904. In the configuration 900, the substrate processing tool 904 includes, for example, 8 process modules 908 and eliminates both the EFEM and any exterior loading stations. Instead, one or more transport carriers (e.g., vacuum wafer carriers) 912 are provided in an interior 916 of the substrate processing tool 904. For example, the carriers 912 may be transported from above the substrate processing tool 904 using an automated transport system, such as an automated material handling system (AMHS). A robot 920 retrieves substrates from the carriers 912 and transfers the substrates to the process modules 908.

Figure 10:
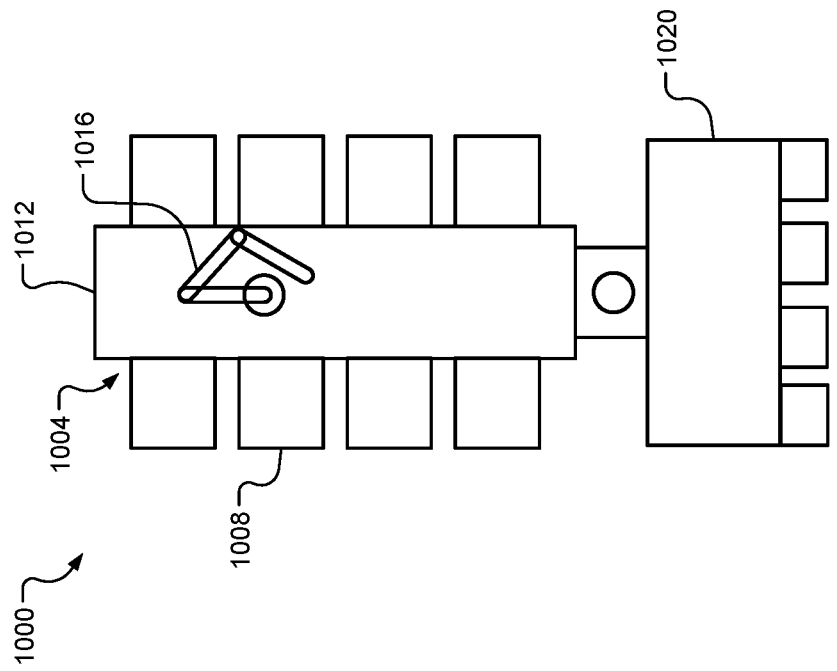
FIG. 10 is an eighth example configuration of a substrate processing tool.

FIG. 10 shows an eighth example configuration 1000 including a substrate processing tool 1004 having a plurality of process modules 1008. The substrate processing tool 1004 includes a linear VTM 1012 and robot 1016 configured to transfer substrates between EFEM 1020 and the process modules 1008. The VTM 1012 is configured to adjust a linear position of the robot 1016 relative to the process modules 1008 (i.e., adjust an end-to-end position of the robot 1016 relative to the VTM 1012).

Figure 11:
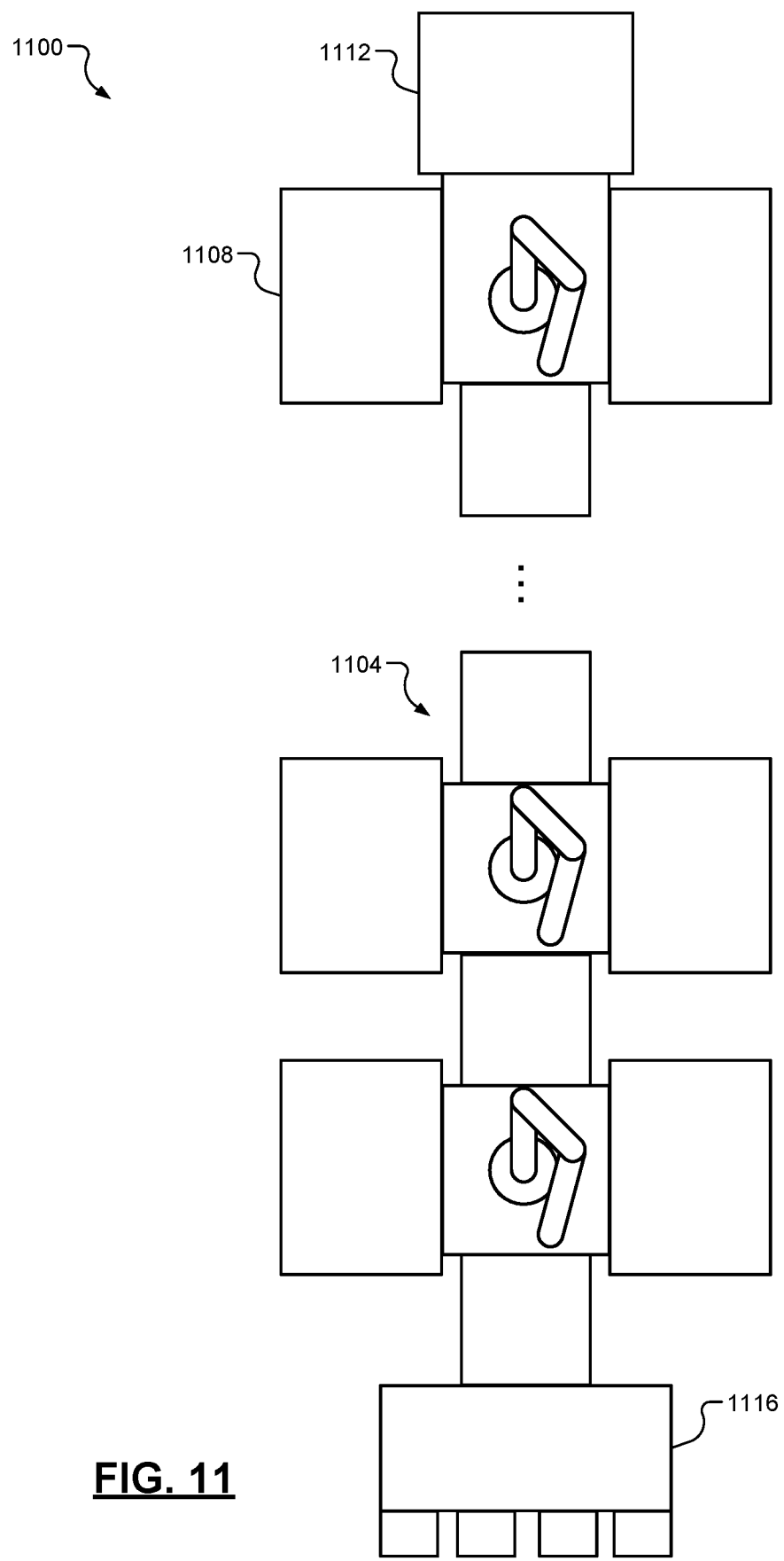
FIG. 11 is a ninth example configuration of a substrate processing tool.

FIG. 11 shows a ninth example configuration 1100 including a substrate processing tool 1104. The substrate processing tool 1104 includes a cluster arrangement of process modules 1108, and an optional end process module 1112. The process modules 1108 share a single EFEM 1116.

In some examples, any of the processing tools described herein may implement loading stations having a stacked configuration. For example, loadings stations 508, 716, 720, etc. as shown in FIGS. 5 and 7 may implement a stacked configuration. In other words, in a stacked configuration, a loading station may include two or more vertically stacked loading stations. In some examples, the stacked configuration may also include a process module or chamber (such as an integrated critical strip (ICS) chamber) vertically stacked with one or more loading stations.

Figure 12:
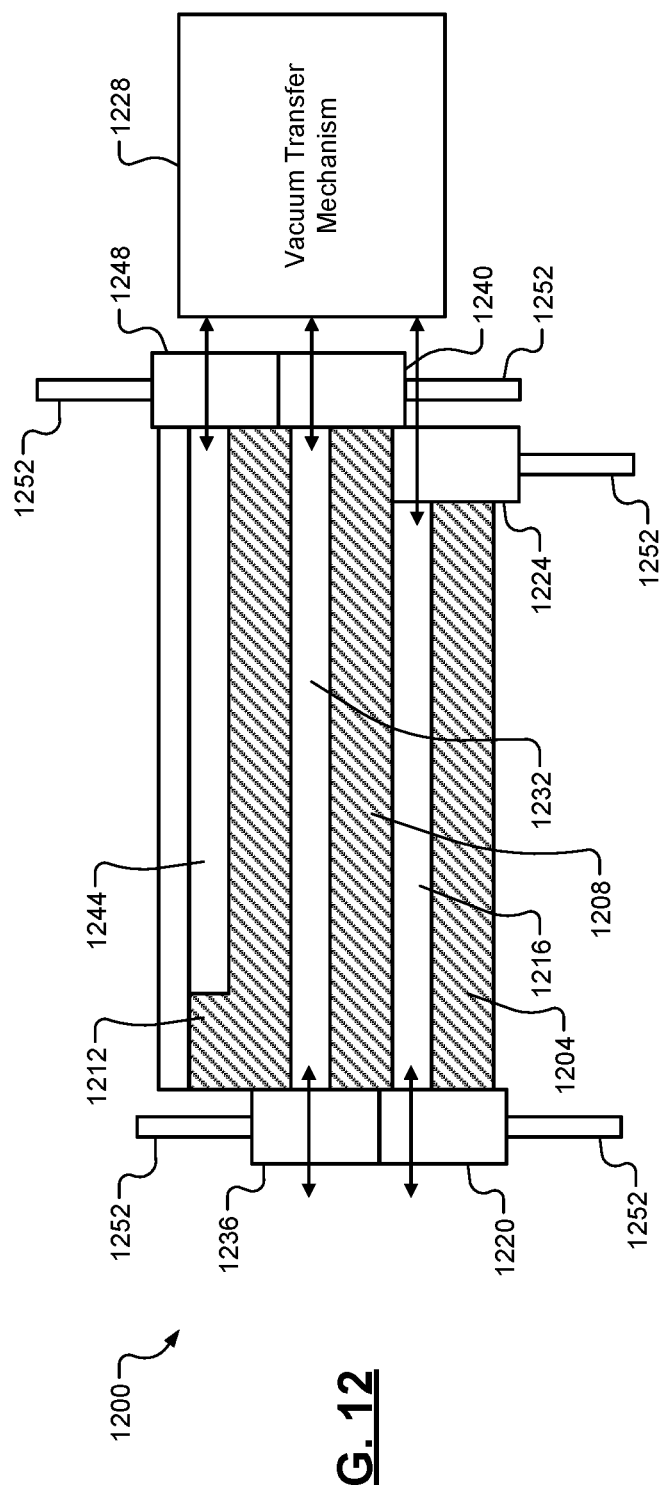
FIG. 12 is an example loading station in a first vertically stacked configuration.

Referring now to FIG. 12, an example loading station 1200 having a vertically stacked configuration includes a first (e.g., lower) airlock loading station 1204, a second (e.g., upper) airlock loading station 1208 arranged above the first airlock loading station 1204, and a process chamber (e.g., an ICS chamber) 1212 arranged above the second airlock loading station 1208.

Wafers are transferred into and out of an airlock chamber volume 1216 of the first airlock loading station 1204 via valves 1220 and 1224. For example, wafers are transferred between the first airlock loading station 1204 and a transport carrier, vacuum wafer carrier, AHMS, etc. in a fabrication room via the valve 1220. Conversely, wafers are transferred between the first airlock loading station 1204 and a VTM 1228 (e.g. for transfer to a process module) via the valve 1224. Similarly, wafers are transferred into and out of an airlock chamber volume 1232 of the second airlock loading station 1208 via valves 1236 and 1240. Wafers are transferred into and out of a process chamber volume 1244 of the process chamber 1212 via valve 1248. Each of the valves 1220, 1224, 1236, 1240, and 1248 may include associated actuators 1252 configured to selectively open and close respective ones of the valves.

Figure 13:
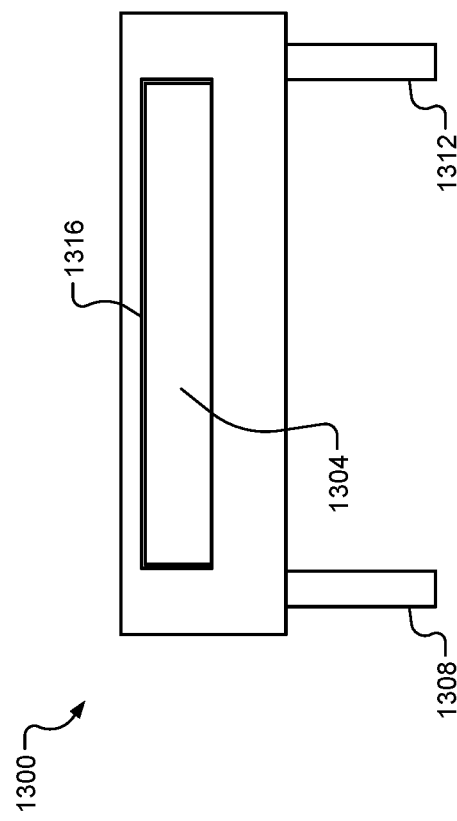
FIG. 13 is an example transfer valve for a loading station.

Referring now to FIG. 13 and with continued reference to FIG. 12, an example valve 1300 is shown. The valve 1300 may correspond to an atmospheric transfer valve or a vacuum transfer valve. For example only, the valves 1220 and 1236 may correspond to atmospheric transfer valves while the valves 1224, 1240, and 1248 may correspond to vacuum transfer valves. In one example, the valve 1300 is a gate-style valve having a gate 1304. Actuators 1308 and 1312 are configured to open and close the gate 1304 to selectively provide access to a chamber volume through a slot 1316 in the valve 1300.

As shown in FIG. 13, the actuators 1308 and 1312 extend downward (or upward) from the valve 1300. For example, in the configuration shown in FIG. 12, the actuators 1252 extend from the respective valves toward an adjacent one of the loading stations 1204 and 1208 or toward the process chamber 1212. Accordingly, one of the loading stations (in this example, the first airlock loading station 1204) is shortened relative to the second airlock loading station 1204 and the process chamber 1212. In other words, a length of the first airlock loading station 1204) is less than a corresponding length of the second airlock loading station 1208 and the process chamber 1212. In this manner, the actuators 1252 of the valve 1240 of the second airlock loading station 1208 are able to extend downward from the valve 1240 (e.g., to cross/overlap a horizontal plane defined by the first airlock loading station 1204) without being obstructed by the valve 1224 of the first airlock loading station 1204.

Conversely, the valves 1236 and 1248 are arranged in a configuration opposite to the valves 1220, 1224, and 1240. In other words, the valves 1236 and 1248 are arranged upside-down relative to the valves 1220, 1224, and 1240. Accordingly, the actuators 1252 of the valves 1236 and 1248 extend upward while the actuators of the valves 1220, 1224, and 1240 extend downward.

Further, wafers are transferred through the slot 1316 into a respective one of the chambers 1216, 1232, 1244 (e.g., using a robot). In the configuration shown in FIG. 12, the actuators 1252 of the valve 1240 extend downward toward the valve 1224 and may obstruct the robot and the transfer of wafers into and out of the first airlock loading station 1204. Accordingly, as shown in FIG. 13 the actuators 1308 and 1312 are spaced apart sufficiently to allow access to the slot 1316. For example, a distance between the actuators 1308 and 1312 may be at least a width of the slot 1316. In this manner, wafers are able to be transferred between the actuators 1252 of the valve 1240 and into the first airlock loading station 1204 via the valve 1224.

Figure 14:
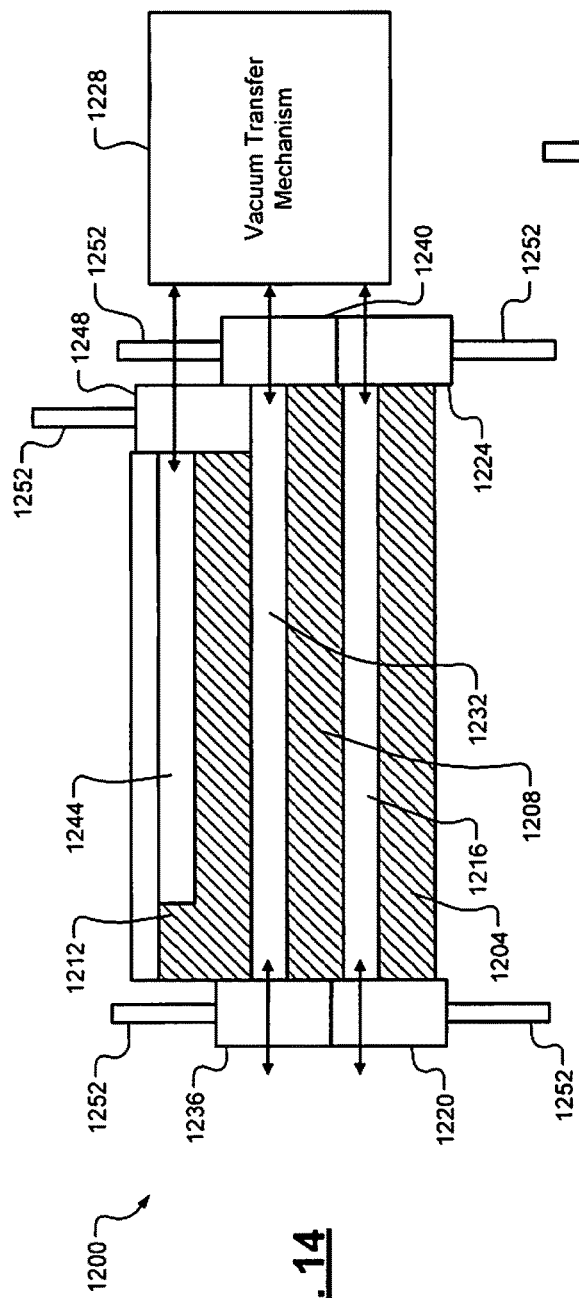
FIG. 14 is an example loading station in a second vertically stacked configuration.

Referring now to FIG. 14, another example configuration of the loading station 1200 is shown. In this example, the process chamber 1212 is shortened relative to the first airlock loading station 1204 and the second airlock loading station 1208 to accommodate the valve 1248. Accordingly, the first airlock loading station 1204 and the second airlock loading station 1208 may have the same length.

Figure 15:
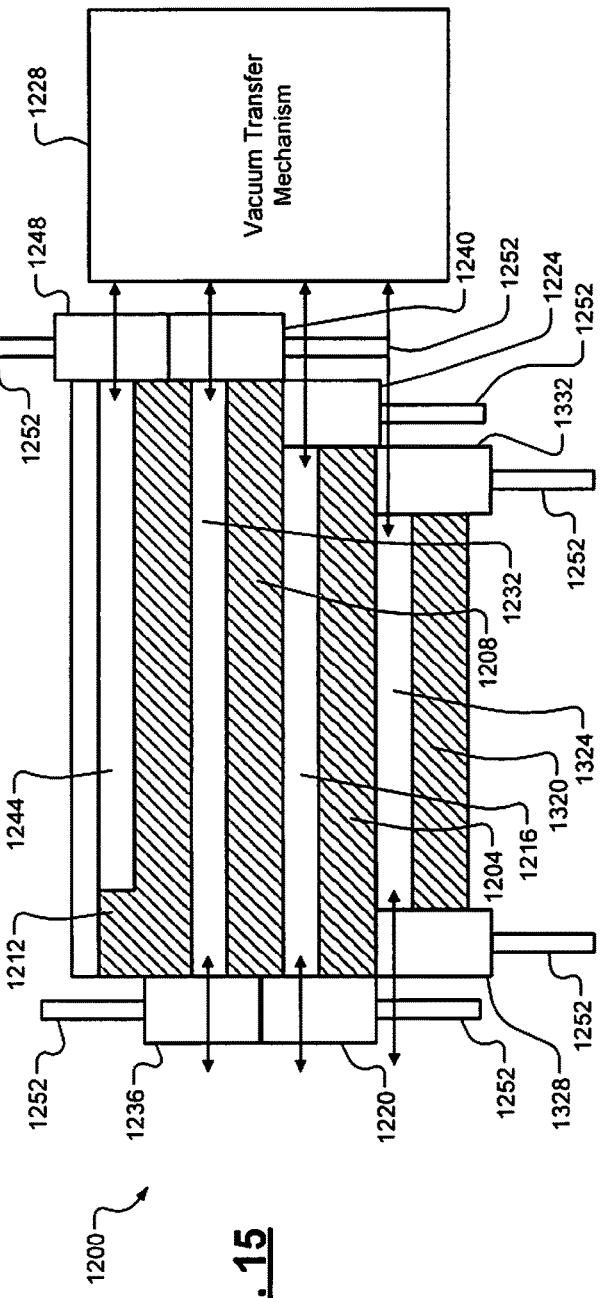
FIG. 15 is an example loading station in a third vertically stacked configuration.

Referring now to FIG. 15, another example configuration of the loading station 1200 is shown. In this example, the loading station 1200 has a configuration similar to the loading station 1200 shown in FIG. 12 and includes an additional third airlock loading station 1320 arranged below the first airlock loading station 1204. The third airlock loading station 1320 includes an airlock chamber volume 1324, valves 1328 and 1332, and respective actuators 1252.

A length of the third airlock loading station 1320 is further reduced relative to the first airlock loading station 1204 to accommodate the valves 1328 and 1332. The actuators 1252 of the valves 1220 and 1224 of the first airlock loading station 1204 extend downward toward the third airlock loading station 1320. Accordingly, the actuators 1252 are spaced apart as described above in FIG. 13 to allow access to the valves 1328 and 1332.

Referring now to FIG. 16, another example configuration of the loading station 1200 is shown. In this example, the loading station 1200 has a configuration similar to the loading station 1200 shown in FIG. 14 and includes the third airlock loading station 1320 arranged below the first airlock loading station 1204. Accordingly, the first airlock loading station 1204 and the second airlock loading station 1208 may have the same length while the length of the third airlock loading station 1320 is reduced.

Referring now to FIG. 17, another example configuration of the loading station 1200 is shown. In this example, the second airlock loading station 1208 and the process chamber 1212 are configured in the manner shown in FIGS. 14 and 16. However, the first airlock loading station 1204 is extended relative to the second airlock loading station 1204. Accordingly, the valve 1220 is positioned further outward relative to the third airlock loading station 1320. In this manner, the length of the third airlock loading station as shown in FIG. 17 may be extended relative to the third airlock loading station 1320 as shown in FIGS. 15 and 16.

Referring now to FIG. 18, another example configuration of the loading station 1200 is shown. In this example, the first airlock loading station 1204, the second airlock loading station 1208, and the process chamber 1212 are configured similar to the arrangement shown in FIG. 17. However, while the valve 1224 is arranged such that the actuators 1252 extend downward toward the third airlock loading station 1320, the valve 1220 is arranged such that the actuators 1252 extend upward toward the second airlock loading station 1208. According, the length of the third airlock loading station 1320 may be even further extended. For example, the second airlock loading station 1208 and the third airlock loading station 1320 may have the same length.

Referring now to FIG. 19, another example configuration of the loading station 1200 is shown. In this configuration, the loading station 1200 includes the third airlock loading station 1320 but does not include the process chamber 1212. As shown, the third airlock loading station 1320 is arranged above and adjacent to the second airlock loading station 1208 and the actuators 1252 of the valves 1328 and 1332 extend upward. However, the third airlock loading station 1320 may be arranged below and adjacent to the first airlock loading station 1204 as in other examples. The third airlock loading station 1320 and the first airlock loading station 1204 may have the same length, which is shortened relative to the length of the second airlock loading station 1208.

Figure 20:
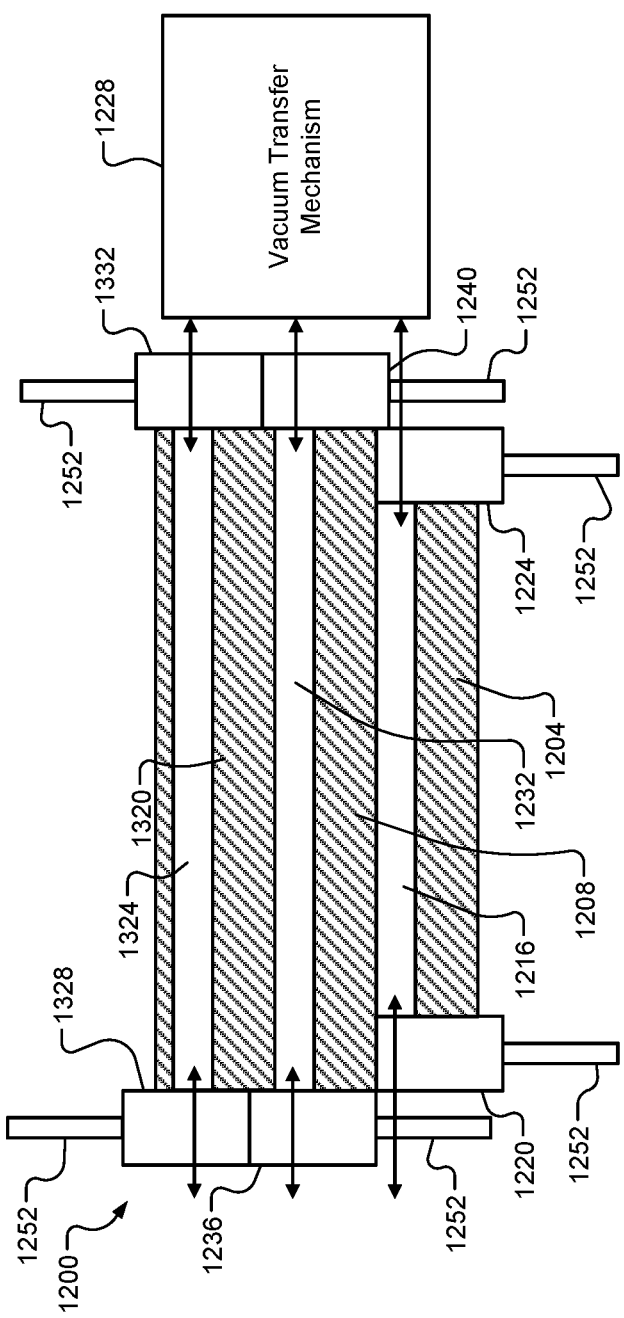
FIG. 20 is an example loading station in an eighth vertically stacked configuration.

Referring now to FIG. 20, another example configuration of the loading station 1200 is shown. In this configuration, similar to the arrangement shown in FIG. 19, the loading station 1200 includes the third airlock loading station 1320 but does not include the process chamber 1212. However, the first airlock loading station 1204 is further shortened relative to the second airlock loading station 1208 and the third airlock loading station 1320. Accordingly, the valve 1236 is arranged such that the actuators 1252 extend downward toward the first airlock loading station 1204, and the length of the third airlock loading station 1320 may be extended. The third airlock loading station 1320 and the second airlock loading station 1208 may have the same length.

Figure 21:
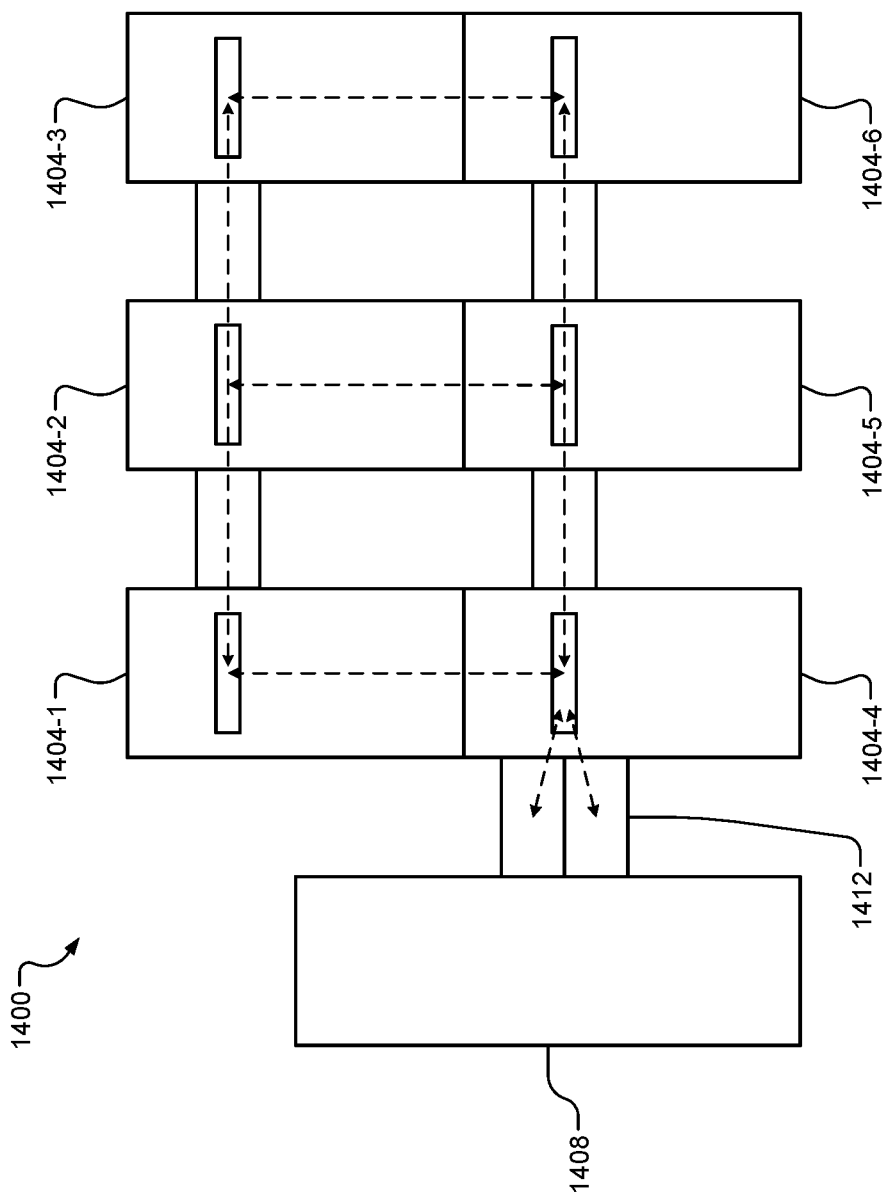
FIG. 21 is an example arrangement of stacked process modules.

Referring now to FIG. 21, an example arrangement 1400 of stacked process modules (including upper process modules 1404-1, 1404-2, and 1404-3 and lower process modules 1404-4, 1404-5, and 1404-6, referred to collectively as process modules 1404) is shown. In this example, wafers are transferred between an EFEM 1408 and the lower process module 1404-4 via a stacked loading station 1412. The wafers may subsequently be transferred between adjacent ones of the lower process modules 1404-4, 1404-5, 1404-6, between the lower process modules 1404-4, 1404-5, and 1404-6 and the upper process modules 1404-1, 1404-2, and 1404-3, between adjacent ones of the upper process modules 1404-1, 1404-2, and 1404-3, etc.

Figure 22:
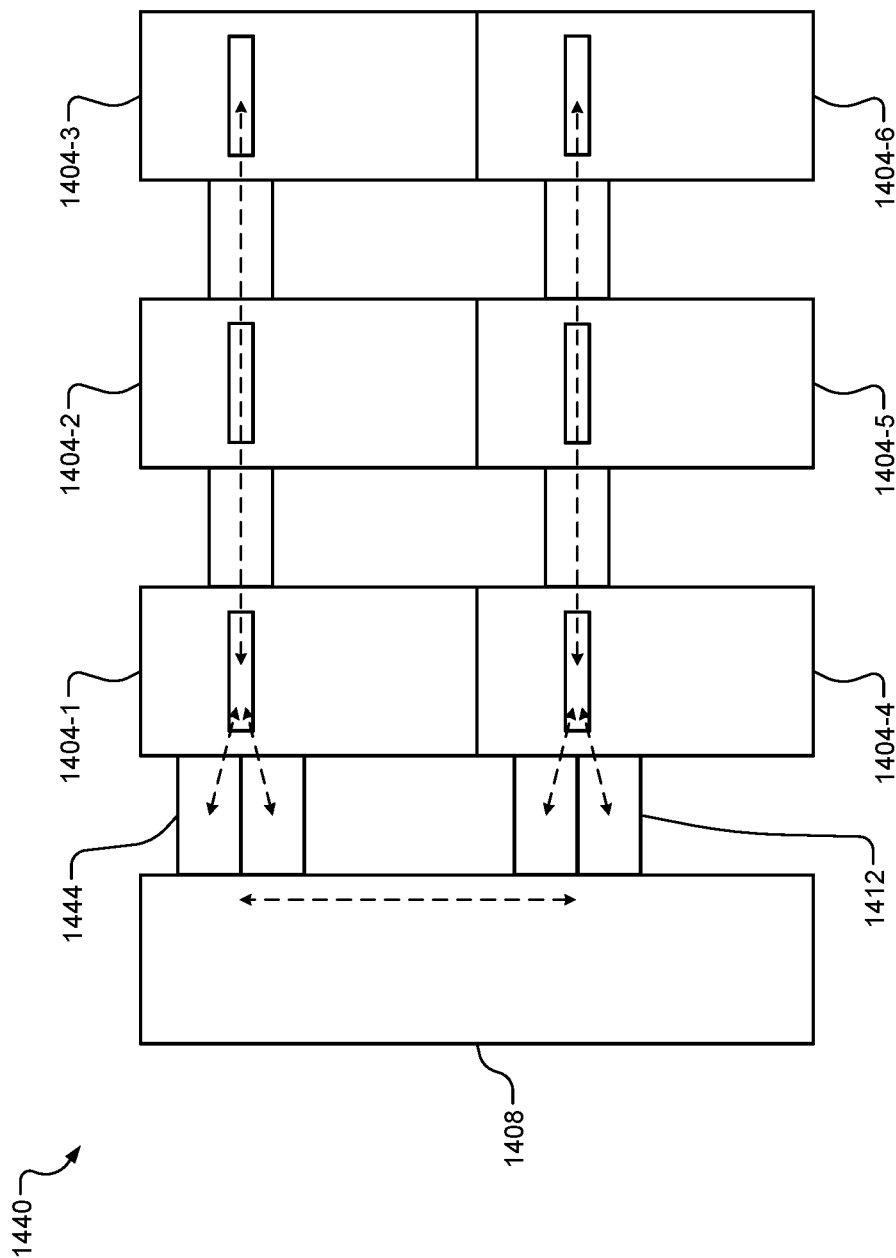
FIG. 22 is another example arrangement of stacked process modules.

Referring now to FIG. 22, another example arrangement 1440 of the stacked process modules 1404 is shown. In this example, wafers are transferred between the EFEM 1408 and the lower process module 1404-4 via the stacked loading station 1412 and between the EFEM 1408 and the upper process module 1404-1 via a second stacked loading station 1444. The wafers transferred via the stacked loading station 1412 may be transferred between adjacent ones of the lower process modules 1404-4, 1404-5, 1404-6. Conversely, the wafers transferred via the stacked loading station 1444 may be transferred between adjacent ones of the upper process modules 1404-1, 1404-2, and 1404-3, etc. In some examples, the wafers may also be transferred between the lower process modules 1404-4, 1404-5, and 1404-6 and the upper process modules 1404-1, 1404-2, and 1404-3.

Figure 23:
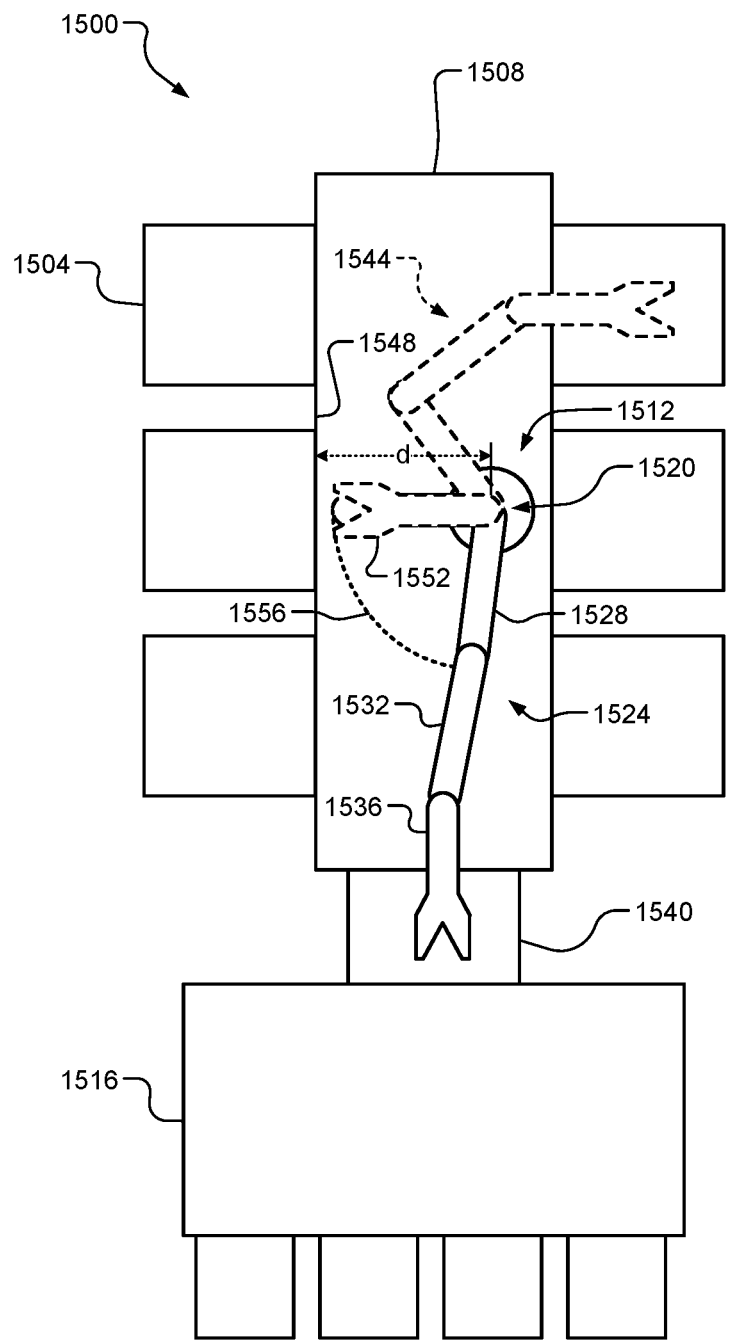
FIG. 23 is an example of a substrate processing tool including a vacuum transfer robot.

Referring now to FIG. 23, another example configuration of a substrate processing tool 1500 having a plurality of process modules 1504 is shown. The substrate processing tool 1500 includes a linear VTM 1508 and a single vacuum transfer robot 1512 configured to transfer substrates between EFEM 1516 and the process modules 1504. As shown, the substrate processing tool 1500 includes six of the process modules 1504. However, other configurations of the substrate processing tool 1500 may include more than six of the process modules 1504. For example, a length of the VTM 1508 may be extended to accommodate additional process modules 1504.

In this configuration, the substrate processing tool 1500 the single vacuum transfer robot 1512 is arranged off-center (i.e. shifted to the right or left toward the process modules 1504) relative to a center lengthwise axis of the VTM 1508. In other words, a primary pivot point 1520 of the robot 1512 is off-center. Although shown having only one arm 1524 having a first arm portion 1528, a second arm portion 1532, and an end effector 1536, in other configurations the robot 1512 may include two or more arms.

The robot 1512 is configured to access a loading station 1540 and each of the process modules 1504. For example, the first arm portion 1528, the second arm portion 1532, and the end effector 1536 have respective lengths such that the arm 1524 is able to access the loading station 1540 when extended as shown. Conversely, the robot 1512 is configured to articulate and retract in various positions (e.g., as shown in phantom at 1544) to access each of the process modules 1504. For example, the length of at least the first arm portion 1528 (and, in some examples, the respective lengths of the second arm portion 1532 and the end effector 1536) does not exceed a lateral distance d between the pivot point 1520 and an inner wall 1548 of the VTM 1508 opposite the pivot point 1520. Accordingly, when the arm 1524 is in a fully retracted position as shown at 1552, the arm 1525 is configured to actuate along an arc 1556 within the VTM 1508 without contacting the inner wall 1548.

Although shown in FIG. 23 in an unstacked (i.e., single level) configuration, in some examples, one or more of the EFEM 1516, the VTM 1508, the process modules 1504, and the loading station 1540 may have a stacked configuration as described above. For example, each of the process modules 1504 may correspond to two process modules 1504 in a vertically stacked configuration (i.e., one process module 1504 arranged above/below the other), the loading station 1540 may correspond to two loading stations 1540 in the vertically stacked configuration, etc. Similarly, the VTM 1508 may correspond to two VTMs 1508 in the vertically stacked configuration. Alternatively, the robot 1512 may be configured to be raised and lowered to different levels within the VTM 1508 to access multiple levels of the process modules 1504, the loading station 1540, etc.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A loading station for a substrate processing system, the loading station having a vertically-stacked configuration and comprising:
    a first loading station, the first loading station comprising
        a first airlock volume, and
        a first valve and a second valve arranged at respective ends of the first loading station, wherein the first valve and the second valve are configured to selectively provide access to the first airlock volume, wherein the first valve and the second valve include a first actuator and a second actuator, respectively, configured to open and close the first valve and the second valve, and wherein the first actuator and the second actuator extend downward from the first loading station; and
    a second loading station arranged above and adjacent to the first loading station, the second loading station comprising
        a second airlock volume, and
        a third valve and a fourth valve arranged at respective ends of the second loading station, wherein the third valve and the fourth valve are configured to selectively provide access to the second airlock volume, wherein the third valve and the fourth valve include a third actuator and a fourth actuator, respectively, configured to open and close the third valve and the fourth valve, a third loading station arranged above and adjacent to the second loading station, the third loading station comprising a third airlock volume, and a fifth valve and a sixth valve arranged at respective ends of the third loading station, wherein the fifth valve and the sixth valve are configured to selectively provide access to the third airlock volume, wherein the fifth valve and the sixth valve include a fifth actuator and a sixth actuator, respectively, configured to open and close the fifth valve and the sixth valve, wherein a length of the first loading station is less than a length of the second loading station, wherein the length of the first loading station corresponds to a horizontal distance between ends of the first loading station and the length of the second loading station corresponds to a horizontal distance between ends of the second loading station, and wherein the third actuator and the fourth actuator each extend downward from the second loading station to overlap a horizontal plane defined by the first loading station.

2. The loading station of claim 1, wherein the first valve, the second valve, the third valve, and the fourth valve correspond to gate valves having respective gates.

3. The loading station of claim 1, wherein the fourth actuator includes a pair of gate actuators, and wherein a distance between the pair of gate actuators is at least a width of a slot of the second valve.

4. The loading station of claim 1, further comprising a process chamber arranged above and adjacent to the third loading station.

5. The loading station of claim 4, wherein a length of the process chamber is less than the length of the second loading station, and wherein the length of the process chamber corresponds to a horizontal distance between ends of the process chamber.

6. The loading station of claim 4, wherein a length of the process chamber is less than a length of the third loading station, wherein the length of the process chamber corresponds to a horizontal distance between ends of the process chamber, and wherein the length of the third loading station corresponds to a horizontal distance between ends of the third loading station.

7. The loading station of claim 1, wherein the length of the second loading station is less than a length of the third loading station, wherein a length of the third loading station corresponds to a horizontal distance between ends of the third loading station, and wherein the sixth actuator extends downward from the third loading station to overlap a horizontal plane defined by the second loading station.

8. The loading station of claim 7, wherein the fifth actuator extends upward from the third loading station.

9. The loading station of claim 1, wherein each of the fifth actuator and the sixth actuator extend upward from the third loading station.

10. The loading station of claim 9, wherein a length of the third loading station is less than the length of the second loading station, and wherein the length of the third loading station corresponds to a horizontal distance between ends of the third loading station.

11. A substrate processing tool, comprising:
the loading station of claim 1;
a first process module adjacent to the loading station, wherein the first process module is configured to receive wafers via the loading station; and
a second process module arranged above the first process module.

12. The substrate processing tool of claim 11, wherein the second process module is configured to receive wafers via the loading station and the first process module.

\* \* \* \* \*